United States Patent [19]

Matsumoto et al.

[11] Patent Number: 5,043,783
[45] Date of Patent: Aug. 27, 1991

[54] SOLID STATE IMAGE SENSOR

[75] Inventors: Shigenori Matsumoto, Takatsuki; Toshihiro Kuriyama, Otsu; Yoshimitu Hiroshima, Hirakata, all of Japan

[73] Assignee: Matsushita Electric Industrial Co., Ltd., Osaka, Japan

[21] Appl. No.: 411,094

[22] Filed: Sep. 22, 1989

[30] Foreign Application Priority Data

Sep. 22, 1988 [JP] Japan .............................. 63-237664
Sep. 22, 1988 [JP] Japan .............................. 63-237665
Sep. 22, 1988 [JP] Japan .............................. 63-237666

[51] Int. Cl.⁵ .................. H01L 29/78; H01L 27/14; H01L 31/06
[52] U.S. Cl. .......................... 357/30; 357/24; 357/32
[58] Field of Search .............. 357/24 LR, 30, 32

[56] References Cited

U.S. PATENT DOCUMENTS

| 4,484,210 | 11/1984 | Shiraki et al. | 357/24 |
| 4,527,182 | 7/1985 | Ishihara et al. | 357/24 |
| 4,851,890 | 7/1989 | Miyatake | 357/24 |

FOREIGN PATENT DOCUMENTS

| 0048480A2 | 3/1982 | European Pat. Off. | 357/30 |
| 0048480A3 | 3/1982 | European Pat. Off. | 357/30 |
| 0224993A1 | 6/1987 | European Pat. Off. | 357/30 |
| 58-171 | 1/1983 | Japan | 357/30 |
| 61-14749 | 1/1986 | Japan | 357/30 |

OTHER PUBLICATIONS

IEEE International Solid-State Circuits Conference, San Francisco, 22th-24th Feb. 1984, vol. 27, Conf. 31, pp. 32, 33, IEEE; New York, U.S.; Y. Matsunaga et al.; "An Interline Transfer CCD Imager".

International Electrode Devices Meeting; San Francisco, Calif., 9th-12th Dec. 1984, pp. 28-31, IEDM; B. C. Burkey et al.; "The Pinned Photodiode for an Interline-Transfer CCD Image Sensor".

"Electronic Shutter for Image Sensor Using Photodiodes"; WO 88/00759; PCT/US87/01662.

Primary Examiner—Jerome Jackson, Jr.
Attorney, Agent, or Firm—Wenderoth, Lind & Ponack

[57] ABSTRACT

A solid state image sensor includes a semiconductor substrate of a first conductivity type, in a plurality of cell units formed in the surface region of the semiconductor substrate. Each of the cell units includes a photo detector portion and an electric charge reading portion. The photo detector portion includes a first impurity region of a second conductivity type formed in the surface region of the semiconductor substrate and a second impurity diffusion region of the first conductivity type formed in the surface region of the first impurity region. The electric charge reading portion includes a third impurity region of the second conductivity type formed in the surface of the semiconductor substrate, a first insulation film formed on the third impurity diffusion region and an electrode formed in the first insulation film.

3 Claims, 6 Drawing Sheets

SOLID STATE IMAGE SENSOR

BACKGROUND OF THE INVENTION

This invention relates to a solid state image sensor used in a video camera and the like.

A charge coupled device (CCD) solid state image sensor, in particular, an interline transfer type CCD solid state image sensor possesses an excellent resolution and a high photo-sensitivity, and hence it has come to be widely used in video camera and other devices.

FIG. 6 is a sectional view of a unit cell of a conventional interline transfer type CCD image sensor using a PN junction photo diode as a photo detector.

In FIG. 6, one unit cell of a solid state image sensor is composed of a photo detector (PD) and a charge reading unit (CCD). A P-type well 2 is formed on an N-type silicon substrate 1. Near the surface in the P-type well 2, P-type channel stop regions 3, 4 for isolating the adjacent unit cells are formed. These channel stop regions 3, 4 are connected to the ground potential. Closely adjacent to one channel stop region 3 in the P-type well 2, an N-type region 5 is formed by diffusing an N-type impurity, and a PN junction photo diode of the photo detector (PD) is formed of the P-type well 2 and N-type region 5. Closely adjacent to the other channel stop region 4 in the P-type well 2, an N-type region 6 is formed by diffusing an N-type impurity. This N-type region 6 is used as the CCD transfer channel for sequentially transferring the signal electric charges generated in the photo detector (PD). The entire surface of the P-well 2 is covered with a silicon dioxide film 7. A polycrystalline silicon electrode 8 is buried in this silicon dioxide film 7. The polycrystalline silicone electrode 8 serves as both a reading gate for reading signal electric charges from the N-type region 5, to the N-type region 6, and a CCD transfer gate. On the surface of the silicon dioxide film 7, an aluminum film 9 is formed. The aluminum film 9 cuts off the incident light from being transmitted into other parts than the photo diode. In order to allow the excessive electric charger to overflow into the N-type silicon substrate 1, a reverse bias voltage of the P-type wafer 2 is applied to the N-type silicon substrate 1 from a bias source 10. (This technique was disclosed, for example, in ISSCC Digest Technical Papers, pp. 168-169, 1982.)

FIG. 6 shows only one unit cell of the CCD solid state image sensor, but actually multiple photo detectors (PD) and charge reading parts (CCD) are arranged in a row in a direction orthogonal to the surface of FIG. 6. Furthermore, in a two-dimensional solid state image sensor, multiple rows of photo detector (PD) and charge reading part (CCD) units are provided.

In such a configuration, when light enters the photo diode through the silicon dioxide film 7 through the portion not covered by the aluminum film 9, electric charges are generated in the vicinity of the N-type region 5 and the P-type well 2 which together compose the photo diode. The electric charges are read out into the N-type region 6 of the CCD by applying a reading potential to the polycrystalline silicon electrode 8, and then, by alternately applying a high potential and low potential to the multiple polycrystalline silicon electrodes 8 arranged in a direction orthogonal FIG. 6 surface of the that is, the electric charges accumulated in the N-type region 6 are sequentially transferred in a direction orthogonal to the surface of the FIG. 6.

Furthermore, in the conventional CCD solid state image sensor shown in FIG. 6, some output current is observed even if the incident light is cut off completely. This kind of noise is called dark current. Dark current is known to increase exponentially with a rise in temperature. Further, the following has been discovered during experiments by the present inventors. The image lag characteristic is known as being one of the important characteristics of the CCD solid stage image sensor. The image lag characteristic is determined according to the structure of the photo diode. Therefore, usually, the image lag is suppressed by using a so-called complete depletion type photo diode. It was, however, found that the dark current increases when the photo diode of the complete depletion type is used in order to improve the image lag characteristic.

When the dark current increases, the ratio of the dark current (N) to signal current (S) increases, particularly at a low illumination intensity, and the so-called, S/N ratio deteriorates. Additionally, if the amplitude of the dark current varies in each photo diode, the fixed pattern noise increases when the illumination intensity is low or the temperature is high.

Therefore, in order to improve the overall characteristics of the CCD solid state image sensor, it is extremely important to suppress the dark current itself and the fluctuations in the amplitude of the dark current in multiple photo diodes.

SUMMARY OF THE INVENTION

It is hence a first object of this invention to present a solid state image sensor capable of suppressing the dark current It is a second object of the invention to present a solid state image sensor capable of suppressing the fluctuations of the dark current among plural photo diodes.

This invention, in sum, is characterized by the formation of an impurity region of a first conductivity type in a principal surface region of an impurity region of a second conductive type composing the photo diode.

When an impurity region of a first conductivity type is formed in the principal surface portion of the impurity region of a second conductivity type, the interface trap level formed in the interface between the semiconductor substrate and the silicon dioxide film on its surface may be reduced, and hence the generation of dark current may be significantly decreased.

Other objects of the invention will be more clearly understood and appreciated from the following detailed description of the embodiments taken in conjunction with the drawings.

DETAILED DESCRIPTION OF THE INVENTION

Figure 1:
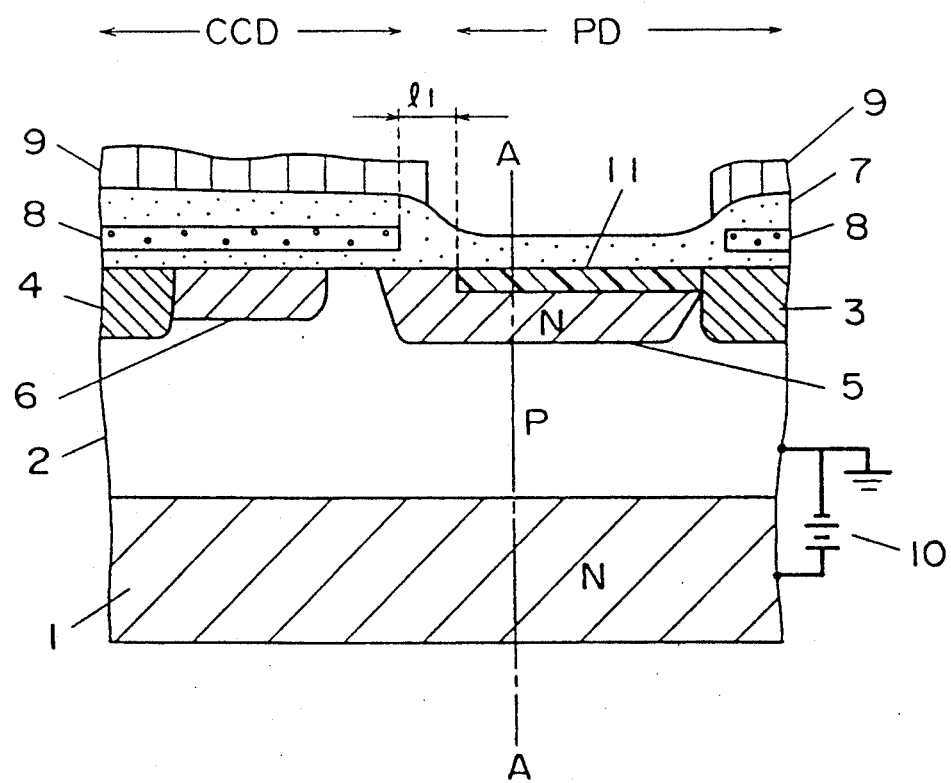
FIG. 1 is a sectional view of a portion of one unit cell of a solid state image sensor in a first embodiment of the invention FIG. 2 (a) is a drawing showing a potential profile along line A—A in FIG. 1.

FIG. 1 is a sectional view of a first embodiment of a solid state image sensor of the invention. In FIG. 1, as in FIG. 6, only one unit cell of the interline transfer type CCD solid state image sensor using a PN junction photo diode as the photo detector, is shown.

Figure 6:
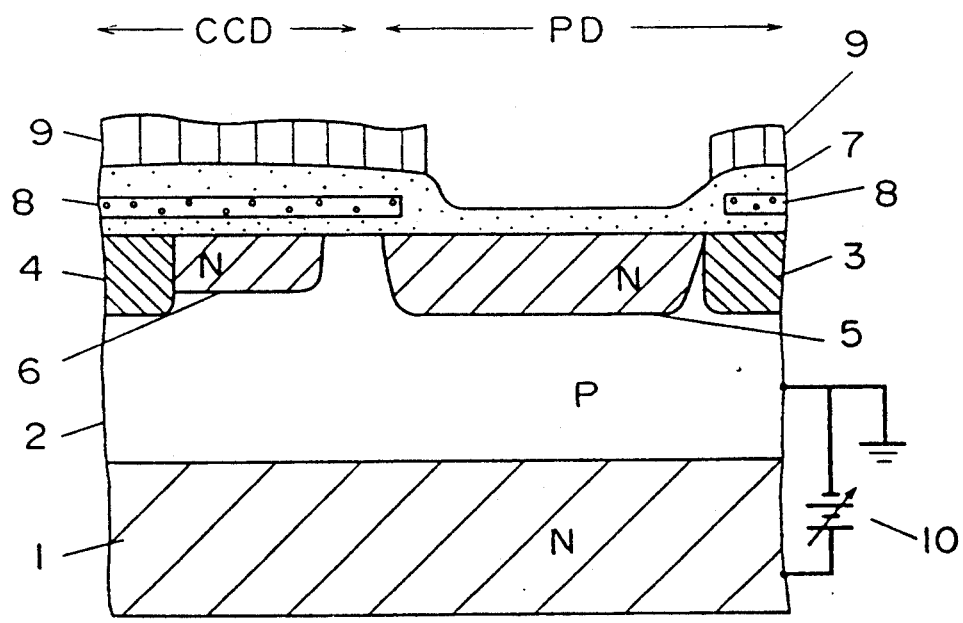

In FIG. 1, the parts which substantially have the same function as the conventional CCD solid state image sensor shown in FIG. 6 are identified with the same reference numerals, and a detailed explanation thereof is omitted.

As is evident from a the comparison between FIG. 1 and FIG. 6, in FIG. 1, a P-type region 11 is formed by injecting or diffusing a P-type impurity in the surface portion of the N-type region 5 forming the photo diode. One edge of the P-type region 11 is located at a position remote from one edge of the polycrystalline silicon electrode 8 by distance $l_1$, while the other edge of the P-type region 11 is connected to the P-type channel stop region 3. Therefore, the P-type region 11 is connected to the ground potential through the channel stop region 3. In this embodiment, the junction depth of the P-type region 11 is 0.5 μm and the surface impurity concentration is $2 \times 10^{18}/cm^3$.

Several causes are considered regarding the generation of dark current, but as a result of experiments by the present inventors, it has been discovered that the depleted region formed in the interface between the silicon substrate and the silicon dioxide film is a principal source of dark current. Also, from the fact, as stated above, that the dark current increases when the photo diode of the complete depletion type is used to improve the image lag characteristic, it is observed that the depleted region in the interface of the substrate and silicon dioxide film is a dominant factor in the generation of dark current.

That is, in the conventional CCD solid state image sensor shown in FIG. 6, a depleted region is formed in the interface of the P-type well 2 and N-type region 5, and a depleted region is also formed in the interface of the N-type region 5 and silicon dioxide film 7. Of these, the depleted region formed in the interface of the N-type region 5 and silicon dioxide film 7, in other words, interface traps existing at the interface, makes it easier to generate electrons. The current generated by these electrons becomes a main component of the dark current. Still more, as a result of damage or electrostatic breakdown in the plasma processing or ion processing steps during the semiconductor processing, the quantity of the interface traps increases. Further, the quantity of interface traps increases exponentially with a rise in temperature, so that the dark current increases as a matter of course.

Accordingly, in the first embodiment of the invention shown in FIG. 1, the P-type region 11 is formed in the portion where the interface traps are generated, that is, in the interface of the N-type region 5 and the silicon dioxide film 7. This P-type region 11 is connected to the ground potential through the P-type channel stop region 3.

Figure 2A:
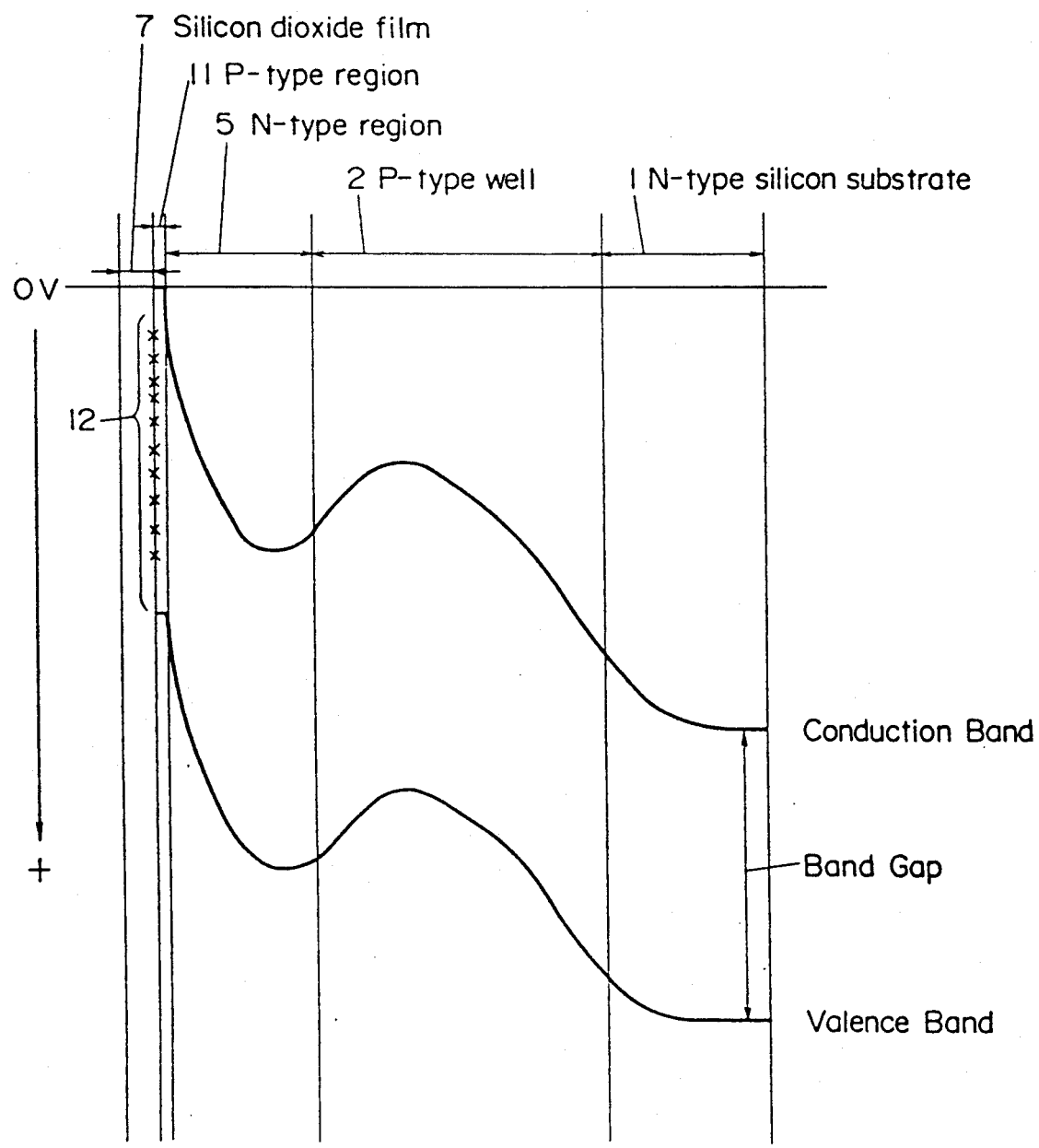
FIG. 2 (b) is a drawing showing a potential profile along line A—A in FIG. 6.
Figure 2B:
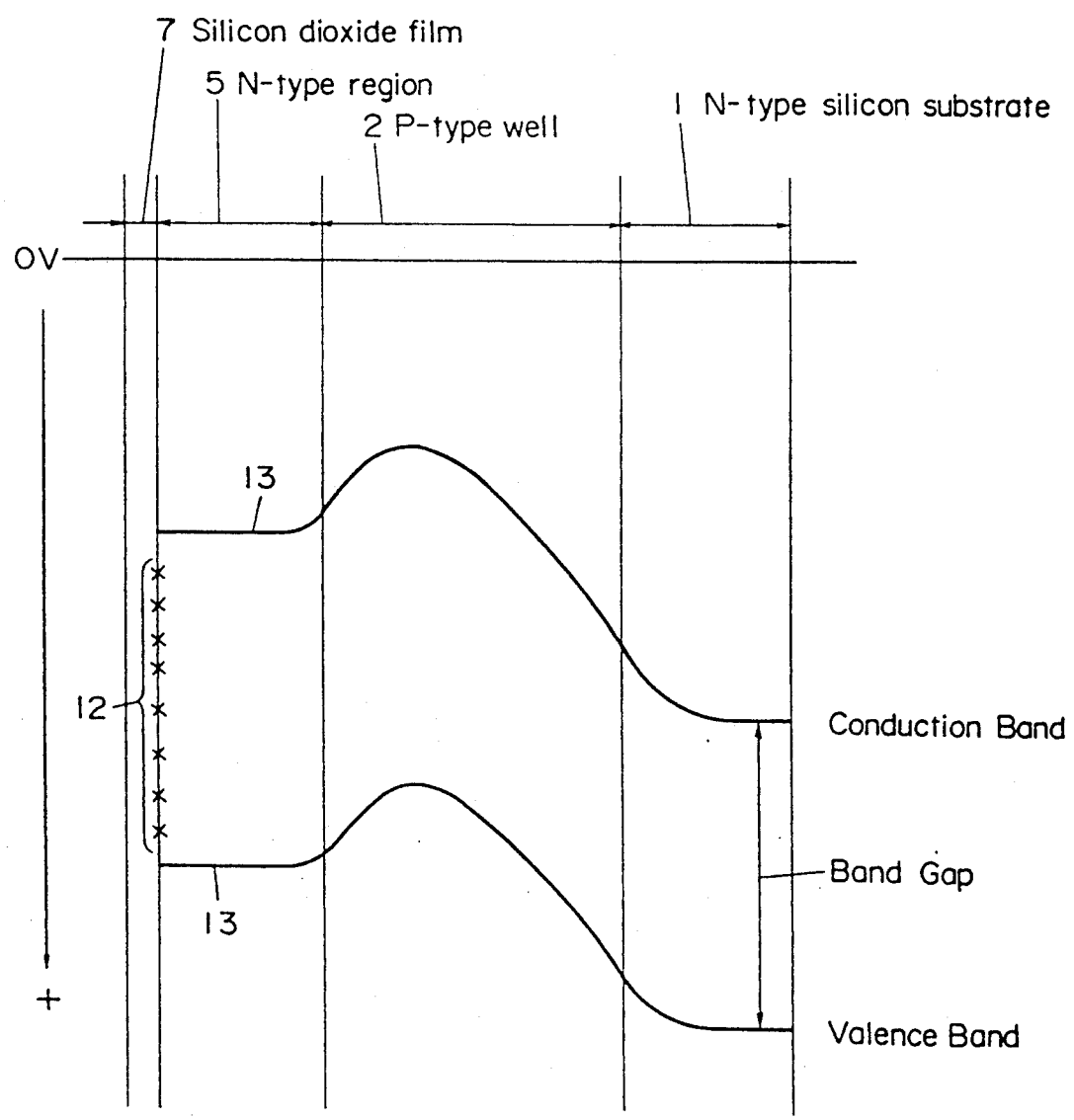
Figure 3A:
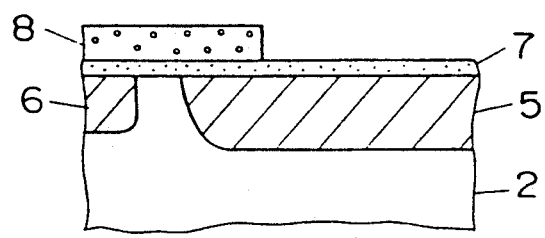
FIG. 3 (a) to (d) are sectional views sequentially showing the manufacturing method of a solid state image sensor according to a second embodiment of the invention.
Figure 3B:
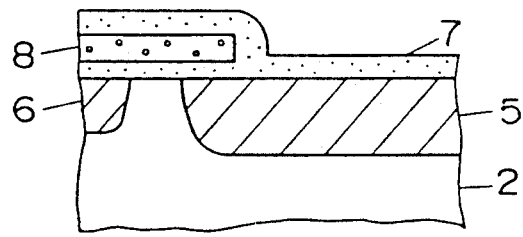
Figure 3C:
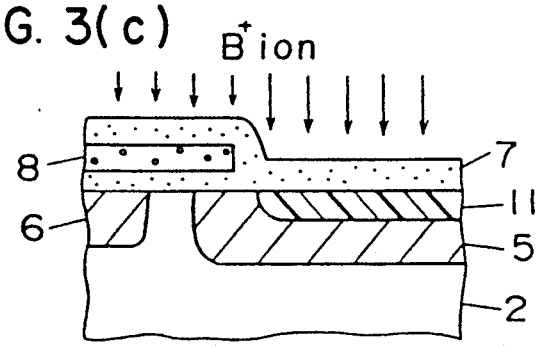
Figure 3D:
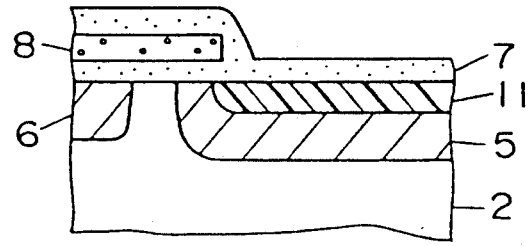

FIG. 2 (a) shows a potential profile along line A—A in FIG. 1. Immediately beneath the silicon dioxide film 7, an interface traps 12 is generated as schematically indicated by the X's shown in FIG. 2 (a). On the other hand, FIG. 2 (b) shows a potential profile along line A-A shown in FIG. 6. In the conventional structure shown in FIG. 6, since the N-type region 5 is formed immediately beneath the silicon dioxide film 7, the potential profile continues flatly from the N-type region 5 to the interface with the silicon dioxide film 7 as shown by reference numeral 13 in FIG. 2 (b). Therefore, the electrons generated from the interface traps flow into the N-type region 5, which causes the dark current. By contrast, in the structure of the first embodiment of the invention as shown in FIG. 1, the P-type region 11 is buried in the surface portion of the N-type region 5, and this P-type region 11 is connected to the grounding potential. Accordingly, the potential profile is fixed at 0V in the P-type region 11 as shown in FIG. 2 (a). As a result, the electrons generated at the interface traps disappear by re-combining with holes through the P-type region 11. Therefore, the electrons generated at the interface trap do not flow into the N-type region 5, and hence the dark current is notably suppressed.

To suppress the dark current, meanwhile, it is desired to bury the P-type region 11 in the entire surface of the N-type region 5. Thus, the affects of the interface trap in the region indicated by $l_1$ in FIG. 1 may be also suppressed. However, when $l_1$ is set at about 0.5 μm, that is, at about the depth of the P-type region 11, the P-type impurity is diffused nearly to the lower part of the polycrystalline silicon electrode 8, which may affect the potential profile reading of the signal electric charge. Hence, an image lag due to imperfect pickup of the signal electric charge may be likely to occur. Therefore, the value of $l_1$ must be determined considering the shape of photo diode and the impurity profile of the N-type region 5, etc. In the embodiment shown in FIG. 1, setting $l_1$ at 0.8 μm, the P-type region 11 was formed in about 80 percent of the surface area of the N-type region 5. At this time, the dark current was decreased to about 25% of the conventional level.

In the embodiment shown in FIG. 1, the impurity concentration of the P-type region 11 is $2 \times 10^{18}/cm^3$. According to experiments by the present inventors, when the impurity concentration of the P-type region was on the order of $10^{17}$, the stability was poor. When the impurity concentration was on the order of $10^{18}$ or more, depletion of the interface during ordinary operation could be prevented, and the dark current could be stably suppressed.

Meanwhile, in the first embodiment of the invention shown in FIG. 1, the structure of the reading gate parts of the CCD, that is, the N-type region 6, polycrystalline silicon electrode 8 and other parts may be same as in the conventional structure. Therefore, the characteristics relating to the function of reading signals are not at all changed. Therefore, it is not required to modify the external circuits connected to the CCD solid state image sensor.

In the embodiment shown in FIGS. 1, 2, it is intended to suppress the dark current itself, but actually the amplitude of dark current components is often different among multiple unit cells, and such fluctuation of the amplitude of dark current may lead to increasing noise, narrowing of dynamic range, and a rough image of the entire picture as if seen through a ground glass at low illumination or high temperature.

Additionally, as stated in relation to the embodiment shown in FIG. 1, when the distance $l_1$ between the polycrystalline silicon electrode 8 and P-type region 11 is narrowed, the dark current decreases, but the potential profile in the overlap area of the polycrystalline silicone electrode 8 and N-type region 5 becomes higher due to the effect of the P-type region 11. Accordingly, an image lag is likely to occur due to the imperfect pickup of the signal electric charge during the reading operation.

In order to suppress such a fluctuation in the amplitude of dark current and to improve the image lag characteristic, it is extremely important to control the position of the P-type region 11 accurately with respect to the polycrystalline silicon electrode 8.

Figure 4:
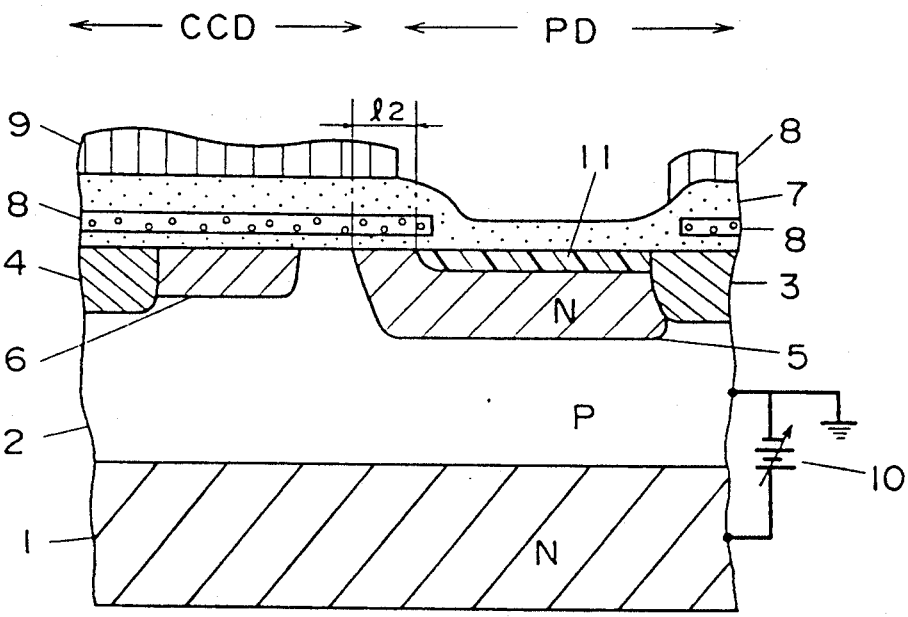
FIG. 4 is a sectional view of a portion of one unit cell of the solid state image sensor in the second embodiment.

FIGS. 3 (a) to (d), which relate to a second embodiment of the invention, sequentially show sectional views of manufacturing steps of a solid state image sensor capable of controlling the position of the P-type region 11 accurately with respect to the polycrystalline silicon electrode 8, and FIG. 4 is a sectional view showing its completed state. Both FIG. 3 and FIG. 4, as FIG. 1, show only the unit cell portion of the interline transfer type CCD solid state image sensor using a PN junction photo diode as the photo detector, and the substantially same parts as shown in FIG. 1 are identified with the same reference numerals.

Hereinafter, the manufacturing method is explained while referring to FIG. 3 (a) to (d).

First of all, as shown in FIG. 3 (a), a polycrystalline silicon electrode 8 is formed on a silicon dioxide film 7. Thereafter, the polycrystalline silicon electrode 8 is oxidized, and the silicon dioxide film 7 of about 2500 Å in thickness is formed on the surface and side face of the polycrystalline silicon electrode 8 [FIG. 3 (b)]. Next, as shown in FIG. 3 (c), boron ions (B+) are injected from the surface of the silicon dioxide film 7 toward the substrate surface. In FIG. 3 (c), boron ions are injected through the silicon dioxide film 7, and at this time the silicon dioxide film 7 at the side face of the polycrystalline silicon electrode 8 is relatively thick, and therefore the polycrystalline silicon electrode 8 and the silicon dioxide film 7 at its side face function as masks when injecting ions. Accordingly, boron ions are injected into the region remote from the edge of the polycrystalline silicon electrode 8. The gap between the edge of the polycrystalline silicon electrode 8 and the boron injection region is determined by the film thickness of the silicon dioxide film 7 at the side face of the polycrystalline silicon electrode 8 grown in FIG. 3 (b). Thereafter, by the heat treatment for about 1 hour at 900° C., the impurities of boron ions are diffused toward the polycrystalline silicon electrode 8, thereby forming a P-type region 11 which partly overlaps with the polycrystalline silicon electrode 8 [FIG. 3 (d)].

Thereafter, by forming an aluminum film 9 for cutting off light on the surface of the silicon dioxide film 7, the unit cell portion as shown in FIG. 4 is completed.

In this manufacturing process, especially in the thermal diffusion step shown in FIG. 3 (d), when diffusing the boron ion impurities toward the polycrystalline silicon electrode 8, it is important to optimize the process conditions in order to suppress to the extend possible the dark current and the image lag during reading of signal electric charges. When such process conditions are optimized, the dark current may be sufficiently suppressed and the image lag characteristic may be satisfactorily maintained without having to maintain a distance of $l_1$ between the P-type region 11 and the polycrystalline silicon electrode 8 as in the first embodiment of the invention shown in FIG. 1. According to the experiment by the present inventors, even if the gap $l_2$ in FIG. 4 (the overlapping width of polycrystalline silicon electrode 8 and N-type region 5) is set at 1.0 μm, longer than the junction depth 0.5 μm of the P-type region 11, and the P-type region 11 is diffused up to a point beneath the polycrystalline silicon electrode 8, the boron concentration profile beneath the polycrystalline silicon electrode 8 can be accurately controlled by optimizing the film thickness of the silicon dioxide film 7 at the side face of the polycrystalline silicon electrode 8 shown in FIG. 3 (c) and the thermal diffusion conditions in FIG. 3 (d), and as a result the dark current characteristic and image lag characteristic can be improved at the same time.

Thus, the feature of the second embodiment of the invention as discussed with reference FIGS. 3, 4 is that the position or the area of the P-type region 11 is accurately controlled by self-alignment on the basis of the end portion of the polycrystalline silicon electrode 8. That is, as shown in FIG. 3 (b), the film thickness of the silicon dioxide film 7 at the side face of the polycrystalline silicon electrode 8 can be accurately controlled. Additionally, as shown in FIG. 3 (c), since boron ions are injected by using the polycrystalline silicon electrode 8 and silicon dioxide film 7 as masks, the shape of the P-type region 11 can be accurately controlled. Moreover, when the heat treatment condition in FIG. 3 (d) is optimized, the boron concentration profile beneath the polycrystalline silicon electrode 8 may be also controlled accurately.

Thus, according to the second embodiment shown in FIGS. 3, 4, since the shape of the P-type region 11 and the impurity concentration beneath the polycrystalline silicon electrode 8 can be accurately controlled, fluctuations in the amplitude of the dark current among multiple unit cells may be suppressed. As a result, noise, dynamic range and image lag characteristics are greatly improved.

Incidentally, in the first and second embodiments shown in FIG. 1 and FIG. 4, the aluminum film 9 for cutting off light is formed within the top area of the polycrystalline silicon electrode 8 or in a size slightly projecting from the end portion of the polycrystalline silicon electrode 8. Accordingly, the light obliquely entering the photo diode (PD) from upper right to the lower left corner of the drawings may pass near the end portion of the polycrystalline silicon electrode 8 to directly enter the CCD part. When the CCD directly receives oblique incident light in this way, the signal electric charges due to the oblique incident light may be added to the original transfer electric charges during the CCD reading operation, and it may create a kind of false signal to make the image become unclear, which is known as the smear phenomenon.

Figure 5:
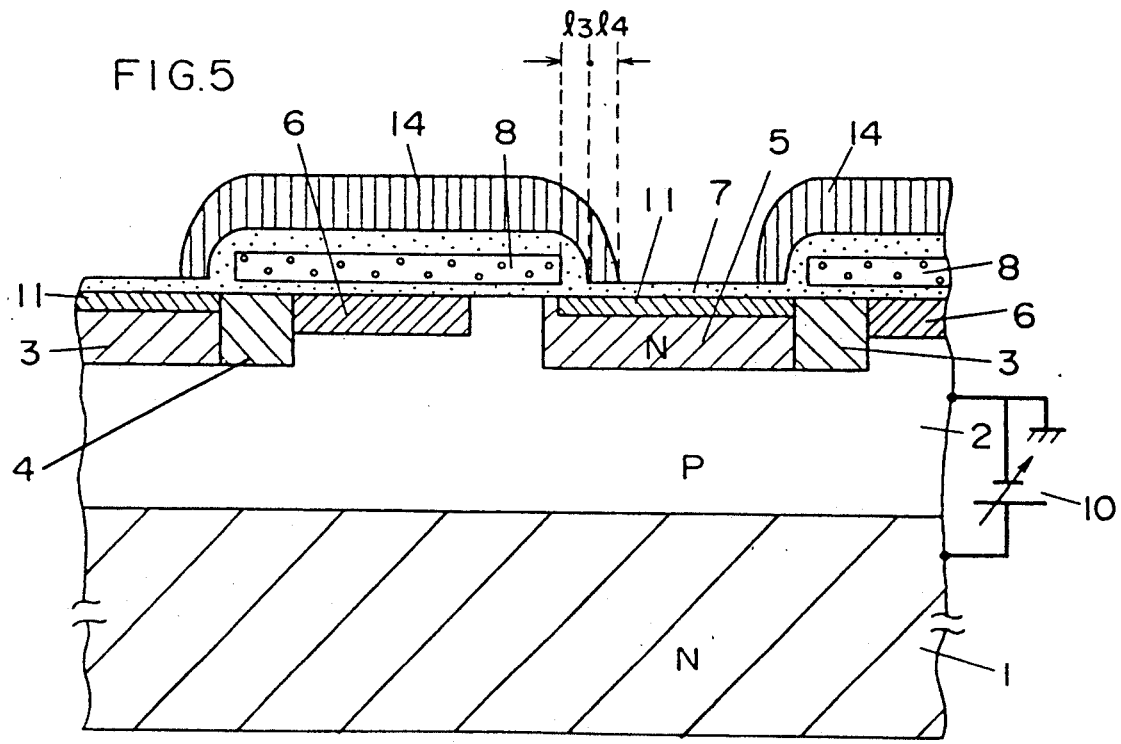
FIG. 5 is a sectional view of a portion of one unit cell of a solid state image sensor in a third embodiment of the invention and FIG. 6 is a sectional view of a portion of one unit cell of a conventional solid state image sensor.

FIG. 5 shows a third embodiment capable of solving such a problem. FIG. 5 also shows, as in the first and second embodiments, only the unit cell portion of the interline transfer type CCD solid state image sensor using a PN junction photo diode as the photo detector. In FIG. 5, the parts which are substantially same in function as those shown in FIGS. 1, 3 are identified with the same reference numerals, and a detailed explanation thereof is omitted. On the surface of a silicon dioxide film 7, an aluminum film 14 for cutting off light is formed in the portion excluding the region of the photo diode (PD). As is evident from FIG. 5, the end portion of the aluminum film 14 is formed so as to cover the surface of the silicon dioxide film 7 at both sides of the polycrystalline silicon electrode 8. In this way, as shown in FIG. 5, the aluminum film 14 is extended to the photo diode (PD) by the total dimension of the film thickness $l_3$ of the silicon dioxide film 7 and the film thickness $l_4$ of the aluminum film 14. As a result, the oblique light entering the CCD part may be securely blocked at the end portion of the aluminum film 14, so that generation of the smear phenomenon may be notably suppressed.

In the foregoing embodiments, meanwhile, the P-type well 2 is used as the substrate. By using the epitaxilaly grown P-type well 2 as the substrate, blooming and the smear phenomena can be suppressed, and it is also effective to bring the spectral response closer to the response of the human eye.

Additionally, in the foregoing embodiments, the excess electric charge is designed to overflow into the N-type silicon substrate 1, but a similar effect is obtained in a method of sweeping out the excess electric charge into the drain formed in the substrate surface portion.

Furthermore, in all of the embodiments herein, the N-type silicon substrate 1 is used, but it may also be possible, needless to say, to use a P-type silicon substrate.

Further, similar effects are also obtained when this invention is applied to a solid state image sensor of types other than the CCD type.

We claim:

1. A solid state image sensor comprising:
a semiconductor substrate of a first conductivity type, a plurality unit cells formed in a surface region of said semiconductor substrate,
each one of said unit cells comprising a photodetector portion for detecting incident light energy and an electric charge reading portion for reading electric charges generated by said photo detector portion,
said photo detector portion comprising said semiconductor substrate, a first impurity region of a second conductivity type formed in the surface region of said semiconductor substrate and a second impurity region of said first conductivity type formed in a substantial portion of a surface region of said first impurity region,
said electric charge reading portion comprising a third impurity region of said second conductivity type formed in the surface region of said semiconductor substrate, a first insulation film formed on said third impurity region and an electrode formed on said first insulation film,
wherein said second impurity region of said photo detector portion and said electrode of said electric charge reading portion have edge portions which overlap one another by a first distance, and wherein said first impurity region of said photo detector and said electrode of said electric charge reading portion have edge portions which overlap one another by a second distance.

2. A solid state image sensor according to claim 1, wherein said second distance is greater than a junction depth of said second impurity region.

3. A solid state image sensor according to claim 1, wherein an impurity concentration of said second impurity region is at least $1 \times 10^{18}/cm^3$.

* * * * *